(12) United States Patent
Kim

(10) Patent No.: US 6,287,902 B1
(45) Date of Patent: Sep. 11, 2001

(54) METHODS OF FORMING ETCH INHIBITING STRUCTURES ON FIELD ISOLATION REGIONS

(75) Inventor: Do-hyung Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/318,188

(22) Filed: May 25, 1999

Related U.S. Application Data

(62) Division of application No. 08/748,148, filed on Nov. 12, 1996, now abandoned.

(30) Foreign Application Priority Data

Jun. 28, 1996 (KR) ................................................ 96-25227

(51) Int. Cl.⁷ .................................................. H01L 21/338
(52) U.S. Cl. ............................................. 438/183; 438/926
(58) Field of Search .................................... 438/183, 926, 438/740, 233, 439

(56) References Cited

U.S. PATENT DOCUMENTS

| | | | |
|---|---|---|---|
| 5,164,806 | 11/1992 | Nagatomo et al. | 257/395 |
| 5,174,858 | 12/1992 | Yamamoto et al. | 156/643 |
| 5,273,936 | 12/1993 | Ikeda | 438/453 |
| 5,293,503 | 3/1994 | Nishigoori | 174/250 |
| 5,306,945 | 4/1994 | Drummond | 257/620 |
| 5,357,133 * | 10/1994 | Morita | 257/316 |
| 5,365,111 | 11/1994 | Ramaswami et al. | 257/768 |
| 5,436,188 | 7/1995 | Chen | 438/397 |
| 5,441,916 * | 8/1995 | Motonami | 437/195 |
| 5,475,266 * | 12/1995 | Rodder | 257/750 |
| 5,550,076 * | 8/1996 | Chen | 438/253 |
| 5,659,202 * | 8/1997 | Ashida | 257/758 |
| 5,698,902 * | 12/1997 | Uehara et al. | 257/773 |
| 5,706,164 | 1/1998 | Jeng | 438/239 |
| 5,789,313 * | 8/1998 | Lee | 438/599 |
| 5,932,920 * | 8/1999 | Kim et al. | 257/395 |

FOREIGN PATENT DOCUMENTS

| | | | |
|---|---|---|---|
| 2724165 | 12/1977 | (DE) . | |
| 0523856A2 | 1/1993 | (EP) | H01L/21/90 |
| 53-108391 | 9/1978 | (JP) | H01L/21/88 |
| 59-76447 * | 5/1984 | (JP) . | |
| 59-76447 | 8/1984 | (JP) | H01L/21/88 |
| 60-66444 | 4/1985 | (JP) | H01L/21/76 |
| 62-177945 | 8/1987 | (JP) | 257/758 |
| 4-63437 * | 2/1992 | (JP) . | |
| 8-335701 * | 2/1992 | (JP) . | |
| 9-64195 * | 3/1997 | (JP) . | |

* cited by examiner

*Primary Examiner*—Olik Chaudhuri
*Assistant Examiner*—Phat X. Cao
(74) *Attorney, Agent, or Firm*—Myers Bigel Sibley & Sajovec

(57) ABSTRACT

A microelectronic structure includes a substrate having adjacent active and field regions. A field isolation layer covers the field region, and an etch inhibiting layer is provided on the field isolation layer adjacent the active region of the substrate. An insulating layer covers the substrate, the field isolation layer, and the etch inhibiting layer, and the insulating layer defines a contact hole therein exposing a portion of the active region adjacent the etch inhibiting layer. Related methods are also discussed.

18 Claims, 2 Drawing Sheets

METHODS OF FORMING ETCH INHIBITING STRUCTURES ON FIELD ISOLATION REGIONS

This application is a divisional application of U.S. patent application Ser. No. 08/748,148 filed Nov. 12, 1996, abandoned, and entitled ETCH INHIBITING STRUCTURES ON FIELD ISOLATION REGIONS AND RELATED METHODS.

FIELD OF THE INVENTION

The present invention relates to microelectronic structures and methods and more particularly to microelectronic structures and methods including isolation regions.

BACKGROUND OF THE INVENTION

As integrated circuit devices become more highly integrated, the space available for individual devices formed thereon is reduced. Accordingly, the sizes of patterns such as gates, bit lines, and metal lines formed on integrated circuits are generally reduced. Furthermore, space between these patterns is also generally reduced.

In particular, integrated circuit memory devices include a plurality of memory cells, and each memory cell is connected to other cells by conductive (metal) lines. The cells and conductive (metal) lines are connected to the substrate or other conductive layers by contact holes or via holes. The contact holes expose active regions of the substrate and the via holes expose the surface of other conductive layers. Patterned layers such as the gate electrodes should be isolated from the holes, and these patterned layers are generally arranged around the holes. Accordingly, the holes must be accurately placed in order to maintain electrical isolation with respect to the patterned layers such as the gate electrodes.

As the space between these patterned layers is reduced, however, the space available for forming the holes may also be reduced. Furthermore, there may be physical limits to the reductions which can be made to the size of the holes. Accordingly, the increased integration reduces the margin available in the placement of the holes. The margin available for the placement of the holes is also influenced by the process limitations of the steps for forming other adjacent patterns. For example, when a LOCOS field oxide layer is formed, the bird's beak phenomenon may reduce the active region. When a trench field oxide layer is formed, the inner wall of the trench may encroach into the active region also reducing the area available to the hole and further decreasing the margin for the formation of the hole.

FIG. 1 is a cross-sectional view of an integrated circuit device having a contact hole 16. The field oxide layer 12 is formed on the semiconductor substrate 10, and the gate electrode 14 is formed on an active region defined by the field oxide layer 12. Spacers 15 are formed along the sidewalls of the gate electrode 14. An insulating layer 20 is then formed on the surface of the substrate including the gate electrode 14 and the field oxide layer 12, and the contact hole 16 is formed therein to expose a portion of the active region of the substrate. The conductive layer 18 is formed on the insulating layer 20 thus filling the contact hole 16. The contact hole 16 is preferably formed over the active region between the gate electrode 14 and the field oxide film 12 so that neither the gate electrode 14 nor the field oxide film 12 is exposed.

While the contact hole 16 is shown centered between the gate electrode 14 and the field oxide layer 12 in FIG. 1, it may become more difficult to form the contact hole between these structures as the device integration increases. As the spaces become smaller, formation of the contact hole 16 may be limited by the physical characteristics of light and the ability to properly align the mask. Accordingly, the margin for error during the formation of the contact hole is reduced. As shown in FIGS. 2 and 3, misalignment of the contact hole photomask may cause the contact hole to expose either the gate electrode 14 or the field oxide layer 12.

As shown in FIG. 2, the misaligned contact hole 24 exposes a portion of the active region as well as a portion of the field region. This misalignment may also result in the formation of a well through the field oxide layer 12 thus exposing a portion of a field region of the substrate when etching the insulating film 20. In other words, a contact hole 24 may partially expose an active region of the substrate and a well in the field region of the substrate. Accordingly, when the contact hole 24 is filled with the conductive layer 18, the conductive layer 18 is brought into contact with the well. Leakage current may thus flow through the conductive layer 18 into the well area. The integrated circuit device may thus overload leading to a delay in the operation of the device or even a malfunction. If a capacitor is formed, the life of the capacitor may also be reduced.

In FIG. 3, a misaligned contact hole exposes a portion of the gate electrode 14. Accordingly, the conductive layer 18 filling the contact hole 25 may contact the gate electrode 14 thus short circuiting the device. The reliability of the integrated circuit device may thus be reduced.

As discussed above, margins for forming contact holes are reduced as device integration increases. For example, the extension of a gate or a field region may reduce the area available for a contact hole, thus reducing the process margins. The reduction of process margins in turn causes a reduction in the alignment margin for the photomask used to form the contact hole. Accordingly, alignment of the photomask may become more difficult. The contact holes for integrated circuit devices may thus be more difficult to form and the alignment thereof may also be more difficult.

Accordingly, there continues to exist a need in the art for improved contact hole structures and related methods.

SUMMARY OF THE INVENTION

It is therefore an object of the present invention to provide improved contact hole structures and methods.

It is still another object of the present invention to provide increased alignment tolerances for the formation of contact holes.

These and other objects are provided according to the present invention by structures and methods wherein an etch inhibiting layer is provided on a field isolation layer adjacent the active region of the substrate. This etch inhibiting layer allows the misalignment of the contact hole without damaging the field isolation, layer. Accordingly, the yield and reliability of integrated circuit devices formed according to the present invention can be increased at a given level of integration.

In particular, a microelectronic structure includes a substrate having active and field regions and a field isolation layer which covers the field region, and first and second patterned conductive layers. The first patterned conductive layer is on the active region of the substrate spaced apart from the field region, and the second patterned conductive layer is on the field isolation layer adjacent the active region of the substrate. The second patterned conductive layer thus acts as the etch inhibiting layer protecting the field isolation layer.

The structure can also include an insulating layer covering the substrate, the field isolation layer, and the first and second patterned conductive layers, and the insulating layer includes a contact hole therein exposing a portion of the active region between the first and second patterned conductive layers. The contact hole can thus extend over the field region without damaging the field isolation layer because the first patterned conductive layer protects the field isolation layer.

In addition, the first and second patterned conductive layers may include insulating spacers along sidewalls thereof, and the insulating layer can preferably be selectively etched with respect to the insulating spacers. In particular, the insulating layer can be formed from nitride.

The second patterned conductive layer is preferably electrically isolated so that it serves no electrical function in the completed device. This layer can thus act only as an etch inhibiting layer to protect the field isolation layer. Furthermore, the field isolation layer can be formed from oxide, and the field region can be a trench in the substrate with the field isolation layer filling the trench.

According to another aspect of the invention, a method includes the steps of defining adjacent active and field regions on a substrate, and forming a field isolation layer on the field region. An etch inhibiting layer is formed on the field isolation layer adjacent the active region of the substrate. An insulating layer is then formed on the substrate, the field isolation layer, and the etch inhibiting layer, and a contact hole is formed in the insulating layer. This contact hole exposes a portion of the active region of the substrate adjacent the etch inhibiting layer and the field isolation layer. The etch inhibiting layer thus protects the field isolation layer during the step of forming the contact hole.

The insulating layer can be nitride, and the step of forming the insulating layer can be preceded by the step of forming a patterned conductive layer on the active region of the substrate. More particularly, the etch inhibiting layer and the patterned conductive layer can each include a conductive portion and insulating spacers along sidewalls thereof. Preferably, the steps of forming the etch inhibiting layer and forming the patterned conductive layer are performed simultaneously. In addition, the etch inhibiting layer is preferably electrically isolated, and the field isolation layer can be oxide.

The methods and structures of the present invention thus provide protection for the field isolation layer during the formation of a contact hole. Accordingly, a greater degree of misalignment during the step of forming the contact hole can be tolerated.

DETAILED DESCRIPTION

Figure 1:
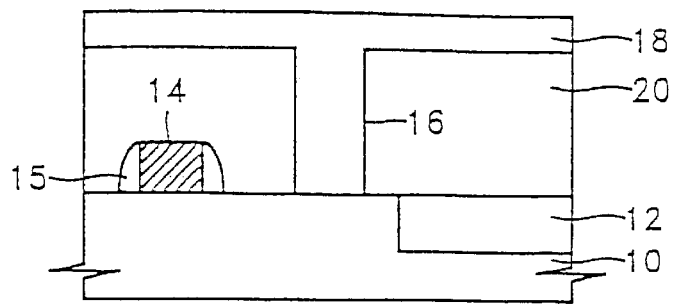
FIG. 1 is a cross sectional view illustrating a contact hole formed according to the prior art.
Figure 2:
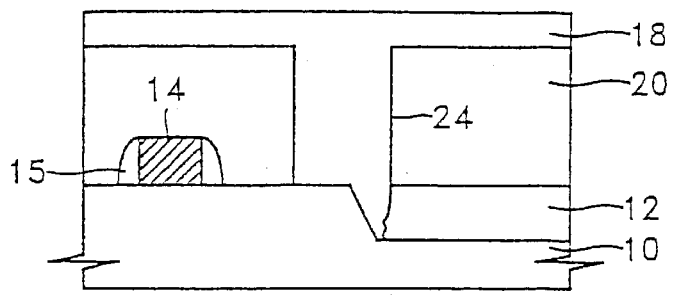
FIG. 2 is a cross sectional view illustrating a first misaligned contact hole formed according to the prior art.
Figure 3:
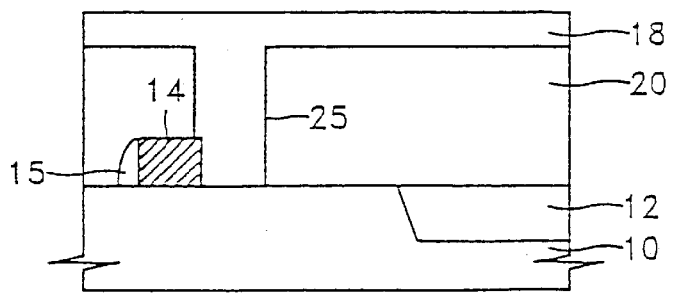
FIG. 3 is a cross sectional view illustrating a second misaligned contact hole formed according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 4:
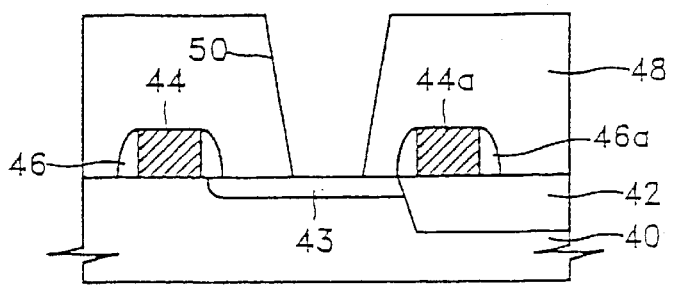
FIG. 4 is a cross sectional view illustrating a contact hole formed according to the present invention.

A contact hole formed according to the present invention is illustrated in FIG. 4. As shown, a field isolation layer 42 is formed on a field region of the substrate 40, and the field isolation layer 42 can be an oxide layer. Portions of the substrate 40 not covered by the field isolation layer 42 define the active region where microelectronic devices will be formed. As also shown, the field isolation layer 42 may be formed in a trench. Alternately, the field oxide layer may be formed by a LOCOS-type method.

First and second patterned conductive layers 44 and 44a are formed respectively on the active region of the substrate and on a field isolation layer 42. Insulating spacers 46 and 46a are formed along the sidewalls of the first and second patterned conductive layers 44 and 44a. In particular, the first patterned conductive layer 44 can be a gate electrode of a transistor. The second patterned conductive layer 44a preferably has the same structure as the first patterned conductive layer 44 with the exception that the second patterned conductive layer is electrically isolated. In other words, the second patterned conductive layer 44a serves as a dummy pattern.

An insulating layer 48 is then formed over the surface of the semiconductor substrate including the first and second patterned conductive layers 44 and 44a. A contact hole 50 is then formed in the insulating layer 48 thereby exposing a portion of the active region of the substrate. More particularly, the contact hole 50 may expose a doped layer 43 in the active region of the substrate. The insulating layer 48 is preferably formed from a material such as nitride which is more susceptible to etching than the material used to form the insulating spacers 46 and 46a.

Using the structure discussed above, some misalignment of the contact hole 50 can be tolerated. In particular, if the contact hole extends beyond the active region of the substrate encroaching into the field region, a second patterned conductive layer 44a reduces the likelihood that a well will be formed in the field isolation layer 42. In particular, the second patterned conductive layer 44a can act as an etch stop if needed when etching the insulating layer 48. In other words, contact hole 50 can now extend over the field region without damaging the field isolation layer 42.

When comparing the prior art structure of FIG. 1 with that of FIG. 4, the area over which the contact hole 50 can be formed using the structure of the present invention is larger than the area available using the structure of the prior art. In particular, the contact hole of FIG. 1 must be formed between the gate electrode 14 and the field oxide layer 12. When using the structure of the present invention, however, the area over which the contact hole 50 can be formed extends over a portion of the field region covered by the second patterned conductive layer 44a.

Figure 5:
FIGS. 5–7 are cross sectional views illustrating steps of a method for forming a contact hole according to the present invention.

A method for forming an integrated circuit device according to the present invention will be discussed with reference to FIGS. 5–7. Active and isolation regions of the substrate 40 are defined as shown in FIG. 5. In particular, field isolation layer 42 is formed on the isolation region of the substrate, and the active region of the substrate is left exposed. This field isolation layer can be formed from a layer of oxide. Electronic devices are typically not formed in the isolation region of the substrate. As shown, a trench can be formed on the isolation region of the substrate and this trench can be filled with the field isolation layer. Alternately, a field isolation layer can be formed by other methods such as the LOCOS method. Electronic devices can be formed in the active region of the substrate which is left exposed.

Figure 6:
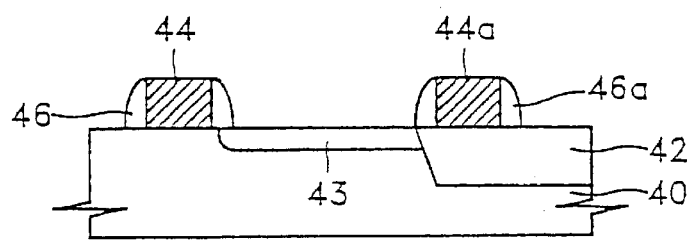

First and second patterned conductive layers 44 and 44a can then be formed as shown in FIG. 6. As shown, a first patterned conductive layer 44 is formed on an active region of the substrate 40, and a second patterned conductive layer 44a is formed on the field isolation layer 42. In particular, an oxide layer and a conductive layer can be sequentially formed on the surface of the substrate 40 including the field isolation layer 42. A photoresist pattern can then be formed on the conductive layer to define the patterned conductive layers. The exposed portions of the conductive layer and the oxide layer can then be isotropically etched to expose portions of the surface of the substrate 40 and the field isolation layer 42. Accordingly, the first and second patterned conductive layers 44 and 44a are respectively formed on the active and field regions of the substrate. The patterned conductive layers can be defined to include an oxide layer adjacent the substrate.

A nitride layer can then be formed over the surface of the patterned conductive layers, the substrate 40, and the field isolation layer 42. This nitride film can be isotropically etched to form the nitride spacers 46 and 46a along the sidewalls of the first and second patterned conductive layers 44 and 44a. As will be discussed below, a contact hole 50 can thus be self-aligned using the spacers 46 and 46a.

Unlike methods of the prior art, the structure formed according to the present invention includes the second patterned conductive layer 44a on the field isolation layer 42. The first patterned conductive layer 44 may be used as a gate electrode, while the second patterned conductive layer 44a can be a dummy pattern serving no electrical function. Instead, the second patterned conductive layer 44a is used to increase a process margin for the formation of a contact hole by allowing the formation of a self-aligned contact hole as discussed below. Accordingly, the second patterned conductive layer 44a is preferably electrically isolated over the field region.

The second patterned conductive layer 44a is formed on a portion of the field isolation layer 42 where a misaligned contact hole would most likely encroach. Accordingly, the second patterned conductive layer 44a can be used to reduce design rule constraints related to the formation of the contact hole. The size of the second patterned conductive layer 44a is determined in part by the size of the contact hole to be formed and the likely position of the contact hole in the event of misalignment.

Figure 7:
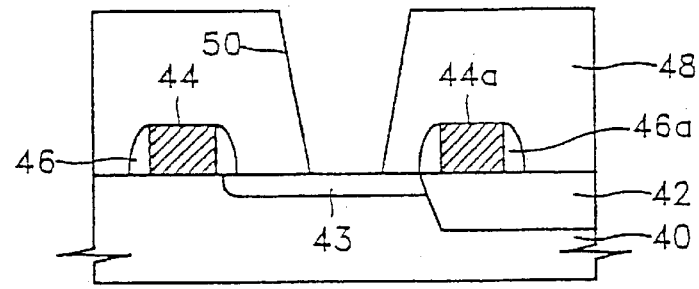

A contact hole 50 is formed as shown in FIG. 7. A conductive layer 43 can be formed in the active region of the substrate by implanting a dopant into the substrate 40. This implant can be masked in part by the patterned conductive layer 44, and the implanting step may be an ion implanting step. The insulating layer 48 can then be formed with a thickness sufficient to cover the first and second patterned conductive layers 44 and 44a. The contact hole 50 is then formed in the insulating layer 48 to expose a portion of the active region between the first and second patterned conductive layers 44 and 44a. The contact hole 50 preferably exposes the doped layer 43 without exposing either of the patterned conductive layers.

Figure 8:
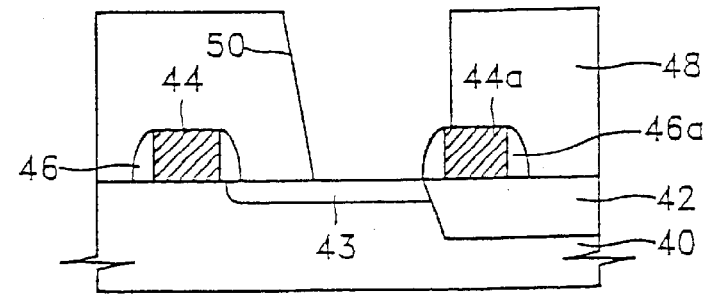
FIG. 8 is a cross sectional view illustrating a misaligned contact hole formed according to the present invention.

The contact hole 50, however, may extend into the field region or into the first patterned conductive layer 44 according to the alignment of the mask used to form the contact hole. As shown in FIG. 8, a self-aligned contact hole 50 may extend over the field region. Because the second patterned conductive layer 44a serves as an etch inhibiting film, the contact hole 50 is self-aligned allowing it to extend over the field region. Stated in other words, the second patterned conductive layer 44a and associated spacers 46a protect the field isolation layer 42 from the etch used to form the contact hole 50. Accordingly, even with a misalignment of the contact hole mask over the field region and over etching to insure exposure of the active region, the field isolation layer 42 is not damaged. The masking and etching margins can thus be increased with respect to the prior art. In the event the contact hole mask is aligned to the first patterned conductive layer 44, a self-aligned contact hole can be formed using the spacers 46.

In the integrated circuit devices of the present invention, patterned conductive layers are simultaneously formed on both the active and field regions. The patterned conductive layer on the field region, however, can be electrically isolated thus serving no electrical function in the completed integrated circuit device. A self-aligned contact hole can thus be formed over the active region of the substrate using the patterned conductive layer formed in the field region to protect the field isolation layer during the etch used to form the contact hole. Because the patterned conductive layer over the field region protects the field isolation layer, the area over which the contact hole can be formed is increased with respect to the prior art. Accordingly, a greater contact margin is allowed when forming the contact hole. Furthermore, the etching margins can be increased without increasing the risk of damaging the field isolation layer. Reliability of the integrated circuit device can thus be increased because leakage current generated by damage to the field isolation layer can be reduced. Furthermore, no extra processing steps are required because the second patterned conductive layer and the first patterned conductive layer (which can be a transistor gate) can be formed simultaneously.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a contact hole for a microelectronic structure, said method comprising the steps of:

defining adjacent active and field regions on a substrate, and circuits thereon;

forming a field isolation layer on said field region;

forming a first patterned conductive layer on said active region of said substrate spaced apart from said field region;

forming an etch inhibiting layer on said field isolation layer adjacent said active region of said substrate, the active region including the first patterned conductive layer wherein said etch inhibiting layer comprises a second patterned conductive layer and an insulating spacer along a sidewall of the second patterned conductive layer, wherein the second patterned conductive layer does not extend over the active region of the substrate, and wherein the second patterned conductive layer is a dummy pattern electrically isolated from the substrate and circuits thereon;

forming an insulating layer on said substrate, said field isolation layer, said first patterned conductive layer, and said etch inhibiting layer; and forming a contact hole in said insulating layer exposing a portion of said active region between said etch inhibiting layer and said first patterned conductive layer.

2. A method according to claim 1 wherein said insulating layer comprises nitride.

3. A method according to claim 1 wherein said first patterned conductive layer comprises a conductive portion and insulating spacers along sidewalls thereof.

4. A method according to claim 3 wherein said steps of forming said etch inhibiting layer and forming said patterned conductive layer are performed simultaneously.

5. A method according to claim 1 wherein said field isolation layer comprises oxide.

6. A method according to claim 1 wherein said step of defining said field and active regions comprises the step of forming a trench in said substrate, and wherein said field isolation layer fills said trench.

7. A method according to claim 1 wherein the insulating spacer of the etch inhibiting layer extends to the active region of the substrate.

8. A method according to claim 1 wherein the insulating spacer and the insulating layer comprise different materials so that the insulating layer can be etched selectively with respect to the insulating spacer.

9. A method according to claim 1 wherein contact hole is formed over the field isolation layer and exposes a portion of the etch inhibiting layer without exposing the field isolation layer to thereby increase the area over which the contact hole can be formed without damaging the field isolation layer.

10. A method according to claim 1 wherein at least a portion of the contact hole is self-aligned with respect to the first patterned conductive layer and the etch inhibiting layer.

11. A method for forming a microelectronic structure, said method comprising the steps of:

defining adjacent active and field regions on a substrate, and circuits thereon;

forming a field isolation layer which covers said field region;

forming a first patterned layer on said active region of said substrate spaced apart from said field region;

forming a second patterned layer on said field isolation layer adjacent said active region of said substrate, the active region including the first patterned layer wherein said second patterned layer comprises a patterned conductive layer and an insulating spacer along a sidewall of the patterned conductive layer, wherein the patterned conductive layer does not extend over the active region of the substrate, and wherein the patterned conductive layer is a dummy pattern electrically isolated from the substrate and circuits thereon;

forming an insulating layer covering said substrate, said field isolation layer, and said first and second patterned layers; and forming a contact hole in said insulating layer wherein said contact hole exposes a portion of said active region between said first and second patterned layers;

wherein said steps of forming said first patterned layer and forming said second patterned layer are performed simultaneously.

12. A method for forming a microelectronic structure, said method comprising the steps of:

defining adjacent active and field regions on a substrate, and circuits thereon;

forming a field isolation layer which covers said field region;

forming a first patterned layer on said active region of said substrate spaced apart from said field region;

forming a second patterned layer on said field isolation layer adjacent said active region of said substrate, the active region including the first patterned layer wherein said second patterned layer comprises a patterned conductive layer and an insulating spacer along a sidewall of the patterned conductive layer, wherein the patterned conductive layer does not extend over the active region of the substrate, and wherein the patterned conductive layer is a dummy pattern electrically isolated from the substrate and circuits thereon;

forming an insulating layer covering said substrate, said field isolation layer, and said first and second patterned layers; and forming a contact hole in said insulating layer wherein said contact hole exposes a portion of said active region between said first and second patterned layers.

13. A method according to claim 12 wherein said field region comprises a trench in said substrate, and wherein said field isolation layer fills said trench.

14. A method according to claim 12 wherein the insulating layer and the insulating spacer comprise different materials so that the insulating layer can be etched selectively with respect to the insulating spacer.

15. A method for forming a microelectronic structure, said method comprising the steps of:

defining adjacent active and field regions on a substrate, and circuits thereon;

forming a field isolation layer which covers said field region;

forming a first patterned layer on said active region of said substrate spaced apart from said field region;

forming a second patterned layer on said field isolation layer adjacent said active region of said substrate, the active region including the first patterned layer wherein said second patterned layer comprises a patterned conductive layer and an insulating spacer along a sidewall of the patterned conductive layer, wherein the patterned conductive layer does not extend over the active region of the substrate, and wherein the patterned conductive layer is a dummy pattern electrically isolated from the substrate and circuits thereon;

forming an insulating layer covering said substrate, said field isolation layer, and said first and second patterned layers; and forming a contact hole in said insulating layer wherein said contact hole exposes a portion of said active region between said first and second patterned layers;

wherein each of said first and second patterned layers comprises insulating spacers along sidewalls thereof.

16. A method according to claim 15 wherein said insulating layer can be selectively etched with respect to said insulating spacers.

17. A method according to claim 16 wherein said insulating layer comprises nitride.

18. A method for forming a microelectronic structure, said method comprising the steps of:

defining adjacent active and field regions on a substrate, and circuits thereon;

forming a field isolation layer which covers said field region;

forming a first patterned layer on said active region of said substrate spaced apart from said field region;

forming a second patterned layer on said field isolation layer adjacent said active region of said substrate, the active region including the first patterned layer wherein said second patterned layer comprises a patterned conductive layer and an insulating spacer along a sidewall of the patterned conductive layer, wherein the patterned conductive layer does not extend over the active region of the substrate, and wherein the patterned conductive layer is a dummy pattern electrically isolated from the substrate and circuits thereon;

forming an insulating layer covering said substrate, said field isolation layer, and said first and second patterned layers; and forming a contact hole in said insulating layer wherein said contact hole exposes a portion of said active region between said first and second patterned layers;

wherein the first patterned layer comprises a patterned gate layer and an insulating gate spacer along a sidewall thereof.

\* \* \* \* \*